(12) United States Patent
Visscher (10) Patent No.: US 11,244,805 B2
(45) Date of Patent: Feb. 8, 2022

(54) ELECTRON MICROSCOPE STAGE

(71) Applicant: FEI Company, Hillsboro, OR (US)

(72) Inventor: Albert Visscher, Veldhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/686,004

(22) Filed: Nov. 15, 2019

(65) Prior Publication Data

US 2021/0151281 A1 May 20, 2021

(51) Int. Cl.
| | |
|---|---|
| *H01J 37/20* | (2006.01) |
| *H01J 37/18* | (2006.01) |
| *H01J 37/28* | (2006.01) |

(52) U.S. Cl.
CPC .............. *H01J 37/20* (2013.01); *H01J 37/18* (2013.01); *H01J 37/28* (2013.01); *H01J 2237/202* (2013.01)

(58) Field of Classification Search
None
See application file for complete search history.

(56) References Cited

U.S. PATENT DOCUMENTS

| | | | |
|---|---|---|---|
| 6,977,461 B2 | 12/2005 | Hendricks et al. | |
| 7,791,043 B2 * | 9/2010 | Seya | H02N 2/028 250/442.11 |
| 2001/0011707 A1 | 8/2001 | Visscher | |
| 2002/0021428 A1 * | 2/2002 | Nakano | H01J 37/20 355/53 |
| 2008/0211349 A1 * | 9/2008 | Seya | H02N 2/0025 310/323.02 |
| 2008/0277582 A1 | 11/2008 | Shi et al. | |
| 2009/0236540 A1 * | 9/2009 | Seya | H01J 37/28 250/442.11 |
| 2013/0146766 A1 | 6/2013 | Ohshima et al. | |
| 2016/0133437 A1 * | 5/2016 | Moers | H01J 37/02 250/307 |
| 2016/0221197 A1 | 8/2016 | Claffee et al. | |
| 2017/0125209 A1 | 5/2017 | Boeij et al. | |
| 2019/0311877 A1 * | 10/2019 | Willis | H01J 37/244 |

FOREIGN PATENT DOCUMENTS

| | | |
|---|---|---|
| CN | 103346692 B | 10/2013 |
| CN | 106707760 A | 5/2017 |
| CN | 107544241 A | 1/2018 |

(Continued)

OTHER PUBLICATIONS

Merry et al., "Using a Walking Piezo Actuator to Drive and Control a High-Precision Stage," *IEEE/ASME Transactions on Mechatronics*, 14(1): 21-31, 2009; (11 pages).

(Continued)

*Primary Examiner* — Andrew Smyth
(74) *Attorney, Agent, or Firm* — Klarquist Sparkman, LLP (57) ABSTRACT

A positioning system for an electron microscope includes a first carriage comprising a holder for holding a workpiece and a second carriage. The first carriage being coupled to one or more first drive units configured to position the workpiece along first, second, and third axes, and along a first tilt axis. The second carriage housing the one or more first drive units and being coupled to one or more second drive units configured to position the workpiece along a second tilt axis.

21 Claims, 8 Drawing Sheets

(56) References Cited

FOREIGN PATENT DOCUMENTS

| EP | 0457317 A1 | * | 11/1991 | ............. H01J 37/20 |
|----|------------|---|---------|--------------------------|
| EP | 0457317 B1 | * | 11/1997 | ............ H01J 37/266 |
| EP | 2973981 A2 |   | 9/2014  |                          |
| EP | 2973981    |   | 5/2018  |                          |
| JP | S59184442 A |  | 10/1984 |                          |
| JP | 06207891 A | * | 7/1994  |                          |
| WO | WO 2018/024416 A1 | | 2/2018 |                      |

OTHER PUBLICATIONS

Micky Rakotondrabe; "Classical Prandtl-Ishlinskii Modeling and Inverse Multiplicative Structure to Compensate Hysteresis in Piezoactuators"; FEMTO-st Institute, UMR CNRS-6174 / UFC / ENSMM / UTBM; Automatic Control and Micro-Mechatronic Systems department (AS2M department); 25000 Besançon—France; (6 pages).

Croft et al., "Creep, Hysteresis, and Vibration Compensation for Piezoactuators: Atomic Force Microscopy Application," *Proceedings of the American Control Conference* 3: 2123-2128, Jun. 2000.

Kang et al., "Development of compact high precision linear piezoelectric stepping positioner with nanometer accuracy and large travel range," Review of Scientific Instruments, 78.7: 75112, Jul. 2007 (8 pages).

Liu and Zhou, "KP Model for Hysteresis of Piezoelectric Ceramic Actuators," *Chinese Automation Congress (CAC), IEEE*: 253-257, Nov. 2015.

Yang et al., "Design and control of a multi-DOF micromanipulator dedicated to multiscale micromanipulation," *Smart Mater Struct.* 26: 115016, 2017 (25 pages).

Examination Report for European Application No. EP 20206830.0, issued by the European Patent Office dated Sep. 7, 2021 (15 pages).

\* cited by examiner

ELECTRON MICROSCOPE STAGE

FIELD

This disclosure pertains positioning systems for holding workpieces in a beam system and methods for their use.

BACKGROUND

High resolution imaging and/or device processing can be accomplished with one or more instruments such as a scanning electron microscope (SEM), a transmission electron microscope (TEM), an ion column, a laser, and/or other beam-generating instruments. Such instruments can require precisely positioning a workpiece to capture an image or process a desired area. Generally, positioning systems include a carrier element to which the workpiece (or specimen to be imaged) can be mounted and a set of actuators, such as motors, arranged to move the carrier element.

Disturbances in position caused by inaccurate positioning and/or vibrations in the actuators can affect the quality of the imaging and/or processing of the workpiece. Accordingly, there is a need for improved positioning systems for positioning workpieces.

SUMMARY

Described herein are embodiments of positioning systems for use with beam systems, as well as methods for moving and positioning a workpiece using such systems.

In a representative embodiment, a positioning system can comprise a first carriage and a second carriage. The first carriage can comprise a holder for holding a workpiece and can be coupled to one or more first drive units configured to translate the workpiece along first, second, and third axes, and to rotate the workpiece around the second axis. The second carriage can house the one or more first drive units and can be coupled to one or more rotational drive units configured to rotate the workpiece around the first axis.

In some embodiments, the one or more first drive units are coupled to the first carriage by one or more strut members. The positioning system can further comprise a column extending from the second carriage and having a body portion and a tip portion. The first carriage can be disposed adjacent the tip portion and the strut members can extend through the body portion.

In some embodiments, the first carriage is coupled to the second carriage via a plurality of elastic strut members. The plurality of elastic strut members can comprise first, second, and third elastic strut members each having a first end portion and a second end portion. The elastic strut members can be disposed in a triangular shape such that the first end portion of each strut member is coupled to the first carriage and the second end portion of each strut member is coupled to the second carriage.

In some embodiments, the one or more first drive units can comprise first, second, and third drive units configured to actuate along axes disposed within a common place and a fourth drive unit configured to actuate along an axis disposed in a plane parallel to the common plane. In such embodiments, the first and second drive units can be configured to move the workpiece along the first and second axes, the third drive unit can be configured to move the workpiece along the third axis, and the fourth drive unit can be configured to rotate the workpiece around the second axis.

The first, second, third, and fourth drive units can be coupled to the first carriage by first, second, third, and fourth elastic members, respectively. In some embodiments, the positioning system can further comprise a fifth drive unit coupled to the first carriage by a fifth elastic member. The fifth elastic member can comprise a first portion coupled to a second portion by a joint such that the fifth elastic member has an L-shape.

In another representative embodiment, a charged particle beam system can comprise a vacuum chamber and a positioning system. The positioning system can extend into the vacuum chamber and can comprise a first carriage and a second carriage. The first carriage can include a holder for holding a workpiece and can be coupled to one or more first drive units configured to translate the workpiece along first, second, and third axes, and rotate the workpiece around the second axis. The second carriage can house the one or more first drive units and can be coupled to one or more rotational drive units configured to rotate the workpiece around the first axis.

In some embodiments, the positioning system can be disposed within the vacuum chamber. In other embodiments, the positioning system can comprise a housing disposed on an outer surface of the vacuum chamber and a column extending into an interior of the vacuum chamber. The column can comprise a body portion and a tip portion, and the first carriage can be disposed within the tip portion.

In some embodiments, the one or more first drive units can comprise first, second, and third drive units configured to actuate along axes disposed within a common plane, and a fourth drive unit configured to actuate along an axis disposed in a plane parallel to the common plane. The first and third drive units can be configured to move the workpiece along the first and second axes, the second drive unit can be configured to move the workpiece along the third axis, and the fourth drive unit can be configured to rotate the workpiece around the first axis.

In a representative embodiment, a method can comprise actuating one or more first drive units coupled to a first carriage holding a workpiece to position the workpiece at a selected position along first, second, and third axes, and rotate the workpiece to a selected position around the second axis. The method can further comprise actuating one or more rotational drive units coupled to a second carriage element to rotate the workpiece to a selected position around the first axis.

Positioning the workpiece at a selected position can comprise positioning the workpiece relative to a charged particle beam (CPB). In such embodiments, the method can further comprise imaging the workpiece using the CPB.

In some embodiments, the second carriage can house the one or more first drive units. In some embodiments, the method can further comprise actuating an additional first drive unit to position the workpiece at a selected position around the third axis.

The foregoing and other objects, features, and advantages of the disclosure will become more apparent from the following detailed description, which proceeds with reference to the accompanying figures.

DETAILED DESCRIPTION

Introduction

The present disclosure concerns systems and methods for moving a positioning system, such as a wafer stage assembly, within a single or multi-beam system. The systems described herein can allow a workpiece such as a semiconductor wafer to be accurately positioned with respect to one or more tools (e.g., a scanning electron microscope (SEM), transmission electron microscope (TEM), ion column, laser beam, etc.) in a process chamber (e.g., a vacuum chamber) where, according to the needs of the system, the tools and/or the workpiece may be positioned at various angles. Although the following systems and methods are described in some examples with reference to semiconductor processing applications, the position systems and control methodologies described herein can also be applicable to other fields where precise positioning and/or imaging are used, such as the preparation and analysis of biological samples.

Example 1

Figure 1:
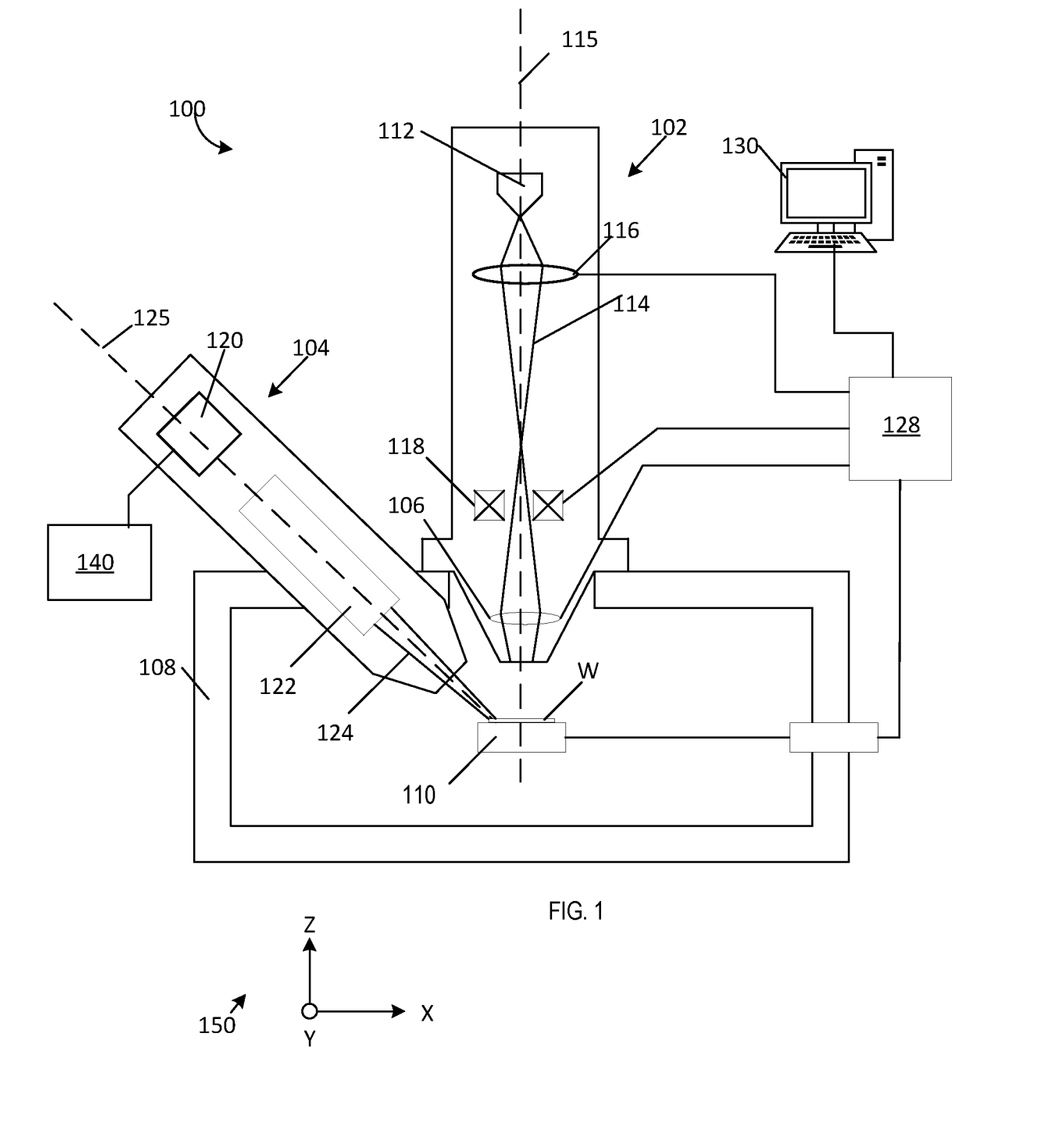
FIG. 1 illustrates a representative embodiment of a beam system.

Referring to FIG. 1, in a representative embodiment, a multi-beam system can be configured as a dual-beam system 100 comprising a scanning electron microscope (SEM) generally indicated at 102 and an ion beam column generally indicated at 104. The SEM 102 can comprise one or more charged particle beam (CPB) lenses such as a condenser lens 116 and an objective lens 106. In some embodiments, one or more CPB lenses can be magnetic lenses, and particularly, the objective lens 106 can be a magnetic objective lens. The ion beam column is arranged to provide a focused ion beam (FIB) to a workpiece W, and the SEM 102 is situated for production of an image of the workpiece W.

The SEM 102 and the ion beam column 104 can be mounted to a vacuum chamber 108 housing a movable positioning system 110 for holding the workpiece W. The vacuum chamber 108 can be evacuated using vacuum pumps (not shown). As discussed in further detail below, the positioning system 110 can be movable along the X-, Y-, and/or Z-axes as shown with respect to a coordinate system 150, wherein the Y-axis is perpendicular to the plane of the page.

In some embodiments, the SEM 102 can be arranged vertically above the workpiece W and can be used to image the workpiece W, and the ion beam column 104 can be arranged at an angle and can be used to machine and/or process the workpiece W. FIG. 1 shows an exemplary orientation of the SEM 102 and the ion beam column 104.

The SEM 102 can comprise an electron source 112 and can be configured to manipulate a "raw" radiation beam from the electron source 112 and perform upon it operations such as focusing, aberration mitigation, cropping (using an aperture), filtering, etc. The SEM 102 can produce a beam 114 of input charged particles (e.g., an electron beam) that propagates along a particle-optical axis 115. The SEM 102 can generally comprise one or more lenses (e.g., CPB lenses) such as the condenser lens 116 and the objective lens 106 to focus the beam 114 onto the workpiece W. In some embodiments, the SEM 102 can be provided with a deflection unit 118 that can be configured to steer the beam 115. For example, the beam 114 can be steered in a scanning motion (e.g., a raster or vector scan) across a sample being investigated or a workpiece to be processed.

The dual-beam system 100 can further comprise a computer processing apparatus and/or a controller 128 for controlling, among other things, the deflection unit 118, charged particle beam (CPB) lenses 106, 116, and detectors (not shown), and for displaying information gathered from the detectors on a display unit. In some cases, a control computer 130 is provided to establish various excitations, record imaging data, and generally control operation of both the SEM and the FIB.

Referring still to FIG. 1, the ion beam column 104 can comprise an ion source (e.g., a plasma source 120) and ion beam optics 122. In the illustrated embodiment, the ion beam column 104 is a plasma focused ion beam (PFIB), however, in other embodiments, the ion beam column 104 can be a standard focused ion beam (FIB) having a liquid metal ion source (LMIS), or any other ion source compatible with a focused ion beam column. The ion beam column 104 can produce and/or direct the ion beam 124 along an ion-optical axis 125. As mentioned above, the ion column 104 can be used to perform imaging, processing and/or machining operations on the workpiece, such as incising, milling, etching, depositing, etc.

In embodiments wherein the ion beam is a PFIB, the ion source 120 can be fluidly coupled to a plurality of gases via a gas manifold 140 that includes gas sources coupled by respective valves to the ion source 120. During operation of the ion source 120, a gas can be introduced, where it becomes charged or ionized, thereby forming a plasma. Ions extracted from the plasma can then be accelerated through the ion beam column 104, becoming an ion beam. In other embodiments, the system 100 can comprise one or more lasers, or other types of milling or diagnostic tools.

As mentioned above, such multi-beam systems can comprise a positioning system (e.g., a stage) configured to hold and position the workpiece W. The positioning system can position/move a carrier element in multiple degrees of freedom, including linear movement (e.g., to choose a particular area for analysis on a workpiece) and/or angular or rotational movement (e.g., to achieve a selected angle of the workpiece relative to an instrument).

Example 2

Figure 2:
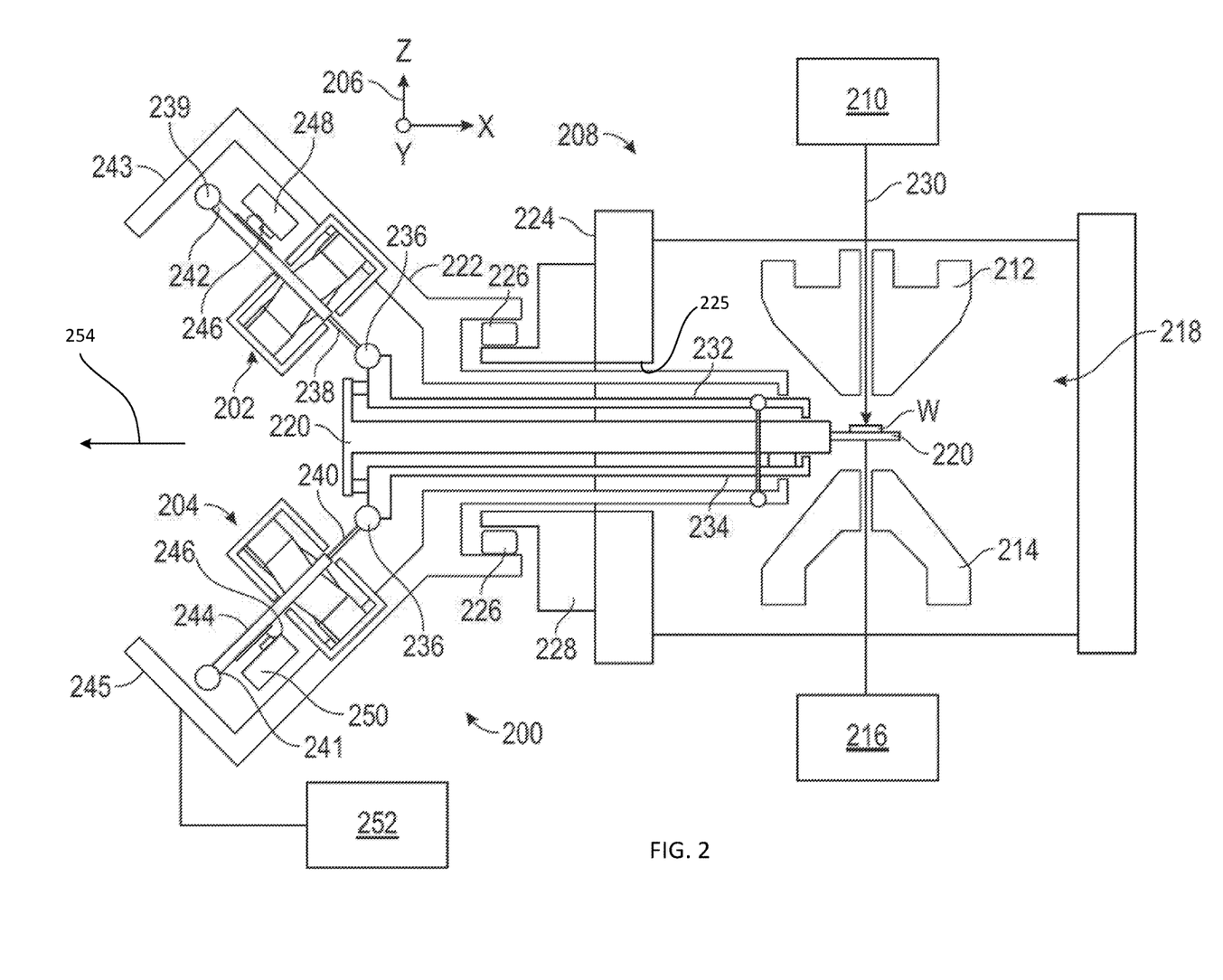
FIG. 2 illustrates a schematic cross-sectional side view of a representative embodiment of a positioning system mounted to the side of an electron microscope system.

FIG. 2 shows a cross-sectional view of an exemplary embodiment of a positioning system 200 coupled to a beam system configured as a charged particle microscope (CPM) generally indicated at 208. The positioning system 200 can comprise one or more drive units. For example, in the illustrated embodiment the system can comprise three drive units, of which two drive units 202 and 204 can be seen in FIG. 2. In the illustrated embodiment, the drive units 202, 204 are configured as walking or stepping piezo drive units, such as Heinmade Piezo Stepper (HMPS) actuators available from Heinmade BV. However, in other embodiments, the drive units can comprise other types of actuators, such as other types of piezo actuators, voice coil motors, rack and pinion systems, linear motors, etc.

The first and second drive units 202, 204 can be configured to position the workpiece W along at least the X- and Z-axes of the coordinate system 206 defined with respect to the beam system 208. As noted above, the positioning system can comprise three or more drive units, allowing for movement of the workpiece along the X-, Y-, and Z-axes. In some particular embodiments, the positioning system can comprise three drive units oriented such that each drive unit is offset from the others by 120 degrees, as described in more detail in further examples.

As noted above, the positioning system 200 can be used with multi-beam systems, such as the CPM 208. The CPM 208 can be, for example, a scanning electron microscope (SEM), transmission electron microscope (TEM), or a combination scanning and transmission electron microscope (STEM). The CPM 208 can comprise a beam source 210, an upper pole objective lens 212, a lower pole objective lens 214, a detector 216 (e.g., a camera, a photomultiplier, photodiode, CMOS detector, CCD detector, photovoltaic cells, etc.). The components can be positioned at least partially within a vacuum chamber 218. A carrier element 220 including a workpiece W positioned thereon is shown extending from the positioning system 200 into the vacuum chamber 218.

Positioning system 200 can comprise a frame or housing 222 coupled to an external surface 224 of the CPM 208 (e.g., an external surface of the vacuum chamber 218). The housing 222 can be coupled to the surface 224 using one or more bearings 226, which allow the housing 222 to tilt or rotate (e.g., about the x-axis) relative to the surface 224. In some embodiments, as shown in FIG. 2, the bearings 226 can be coupled to a mounting element 228 disposed on the surface 224 of the CPM 208.

The housing 222 can be disposed such that a portion of the housing comprising the carrier element 220 for holding the workpiece W can extend through an opening in the side of the CPM 208 and at least partially into the vacuum chamber 218. The positioning system 200 can be configured to adjust the position of the workpiece W relative to the beam 230 by using the drive units (e.g., first and second drive units 202, 204) to adjust the position of the carrier element 220, as described in more detail below.

The carrier element 220 can be coupled to first and second guides 232, 234. Each guide 232, 234 can be further coupled, via respective joints 236 (e.g., a hinge, knuckle joint, ball joint, etc.) to a respective strut member 238, 240. The strut 238 can be pivotably coupled to a mover element or member 242 at a pivot joint 239, and the strut 240 can be pivotably coupled to a mover element or member 244 at a pivot joint 241. The first and second drive units 202, 204 can be configured to engage the mover elements 242 and 244, respectively. The drive unit 202 can be configured to move the mover element 242 along its axis toward and away from a rear wall 243 of the housing 222 in a series of step motions, as described in greater detail below. The drive unit 204 can be configured to move the mover element 244 along its axis toward and away from a rear wall 245 of the housing 222, similar to the mover element 242. The struts 238, 240 (along with the mover elements and the drive units) can be positioned at an angle relative to one another such that motion of the mover element 242 away from the rear wall 243, along with motion of the mover element 244 toward the rear wall 245 can cause the carrier element 220 to tilt out of the X-Y plane. Movement of the mover elements 242 and 244 away from the walls 243 and 245, and toward the CPM 208, can move the carrier element 200 along the X-axis. In the illustrated embodiment, the mover elements 242 and 244 are positioned at an angle of 90° relative to one another. In certain embodiments, three drive units and corresponding mover elements can be arrayed around the axis of the carrier element 220 with an angular spacing of 120°.

Each mover element 242, 244 can comprise a respective encoder scale 246. First and second position encoders 248 and 250 (e.g., optical encoders) mounted to the housing 222 can be configured to determine the position of each mover element 242, 244, respectively, based on the encoder scales 246. The encoder scales 246 can be coupled to or formed integrally with the movers 242, 244.

Each encoder 248, 250 can be configured to determine the position of the respective mover element 242, 244. The location data generated by the encoders 248, 250 can be used by a controller 252 to operate the actuators 202, 204 to position the mover elements 242, 244 at a selected location, thereby positioning the workpiece W at a selected location. Each mover element 242, 244 can comprise a respective encoder scale 246. The first and second position encoders 248 and 250 mounted to the housing 222 can be configured to determine the position of each mover element 242, 244, respectively, based on the encoder scales 246. The encoder scales 246 can be coupled to or formed integrally with the movers 242, 244.

In order to load a workpiece W onto the carrier element 220, the carrier element can be removed from the positioning system 200 by pulling the carrier element 220 through the positioning system 200 in the direction shown by arrow 254. A workpiece can then be loaded onto the end portion of the carrier element 220 and the carrier element can be reinserted through the opening in the side of the CPM.

The drive units 202, 204 can be piezo drive units each comprising first and second sets of actuators. The first and second sets of actuators can be actuated in an alternating, stepping, or "walking" motion such that when the first set of actuators engages with and exerts force on a respective mover element (e.g., mover element 242 or 244), the second set of elements disengages or releases the mover element, and vice versa. There can be a brief period between steps when both sets of actuators and are in contact with the mover 242, 244. This is referred to as a "takeover" condition, when one set of actuators "takes over" from the other set of actuators. This configuration, wherein one actuator of a set engages the first surface of the mover element and the second and third actuators of the set engage the second surface of the mover element helps mitigate distortion during operation, and can provide smoother motion of the mover element. The alternating takeover movement between the two sets of actuators advantageously minimizes slipping between the actuators and the mover element. In addition, this configuration allows for an extension of the stroke length of the drive unit without affecting the stiffness or motion performance. Further details of the piezo motors can be found in the application entitled "Systems and Methods of Clamp Compensation," filed herewith, and also referred to by attorney reference number 9748-102339-01, and in the application entitled "Systems and Methods of Hysteresis Compensation," filed herewith, and also referred to by attorney reference number 9748-102338-01, each of which is incorporated by reference herein in its entirety.

Example 3

Figure 3A:
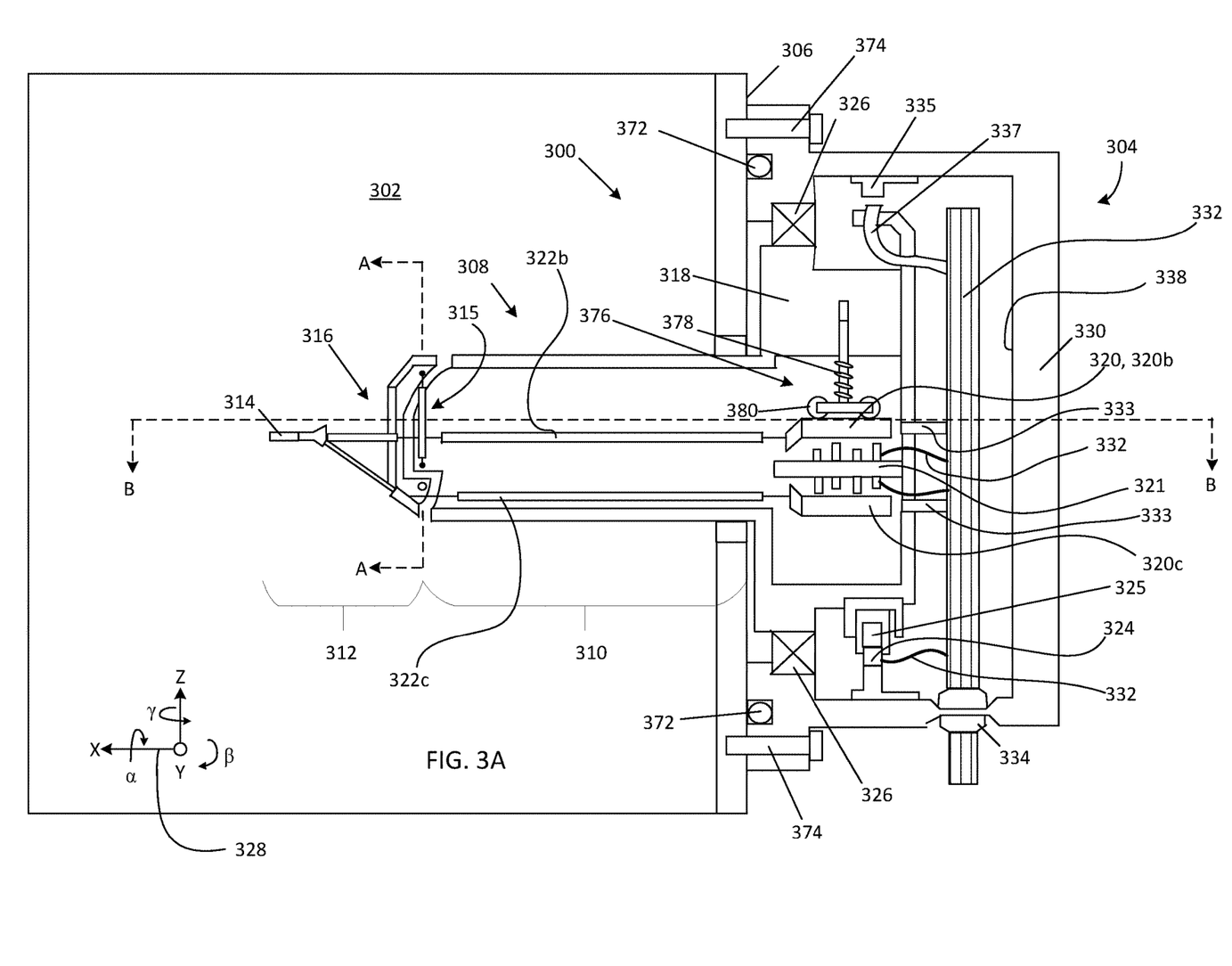
FIG. 3A illustrates a schematic cross-sectional side view of another representative embodiment of a positioning system mounted to the side of an electron microscope system.
Figure 3B:
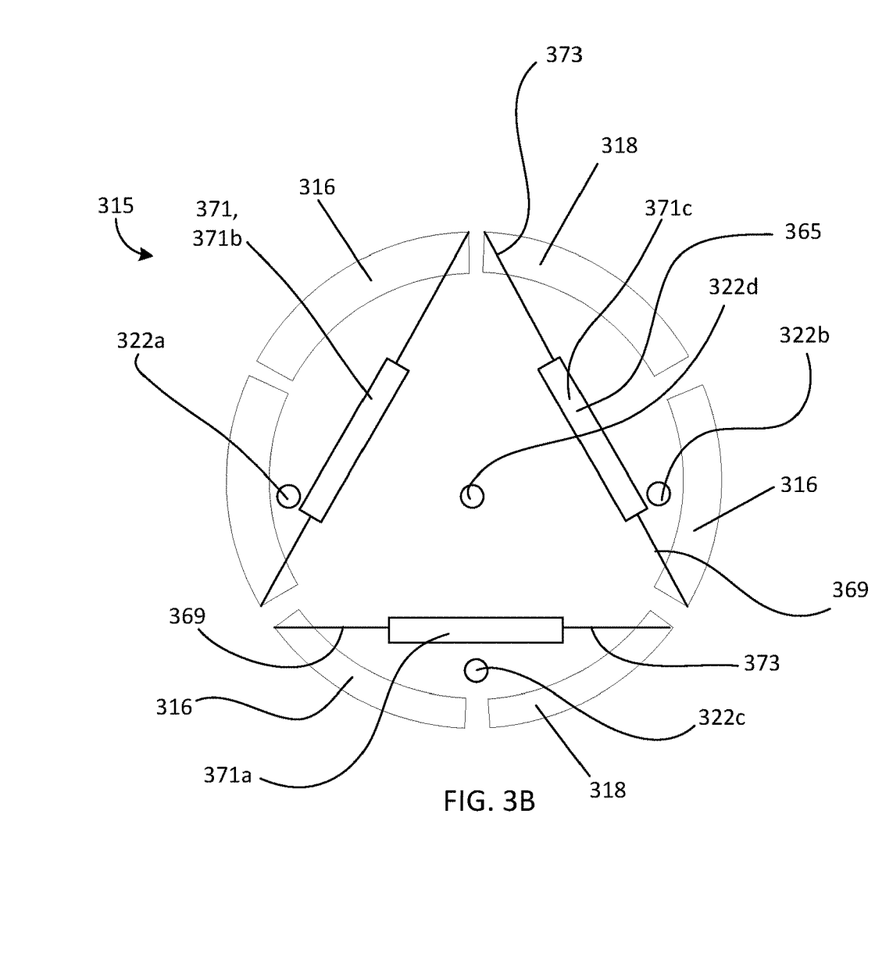
FIG. 3B illustrates a cross-sectional view of the positioning system of FIG. 3 along line A-A.
Figure 3C:
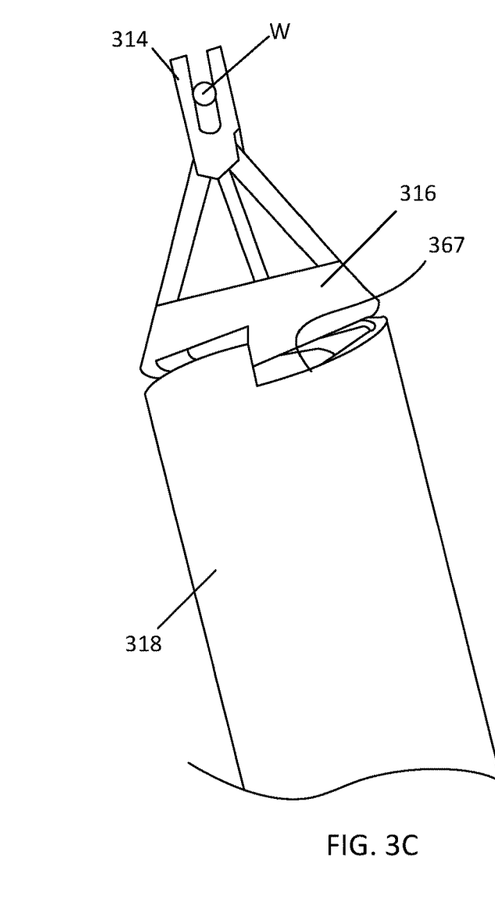
FIG. 3C illustrates a close-up view of the sample carriage and α-tilt carriage.
Figure 4:
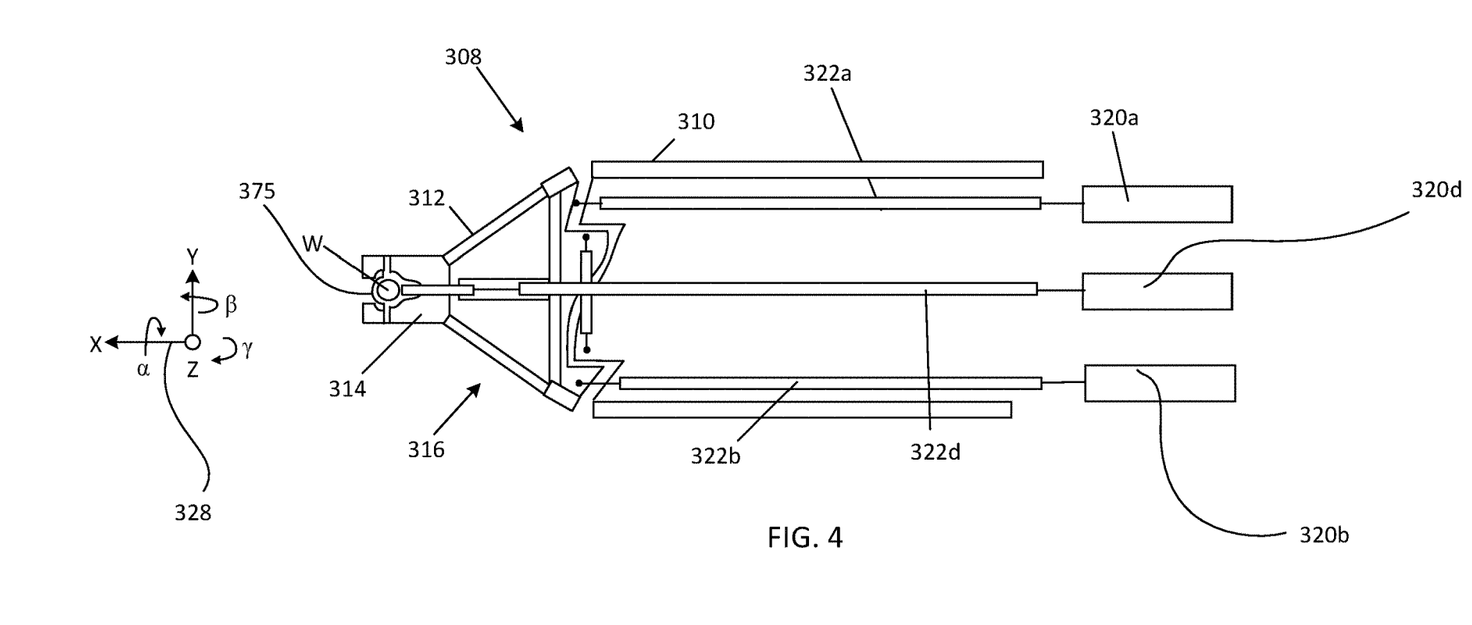
FIG. 4 illustrates a cross-sectional top-down view of a portion of the positioning system of FIG. 3 along line B-B.

FIGS. 3A-4 illustrate another exemplary embodiment of a positioning system 300. The positioning system 300 can be used with a CPM (not shown). The CPM can be, for example, a transmission electron microscope (TEM) (or any of the various other beam systems described above) and can comprise a vacuum chamber 302.

Referring to FIG. 3A, positioning system 300 can comprise a frame or housing 304 mounted on an external surface 306 of the CPM (e.g., an external surface of the vacuum chamber 302) using, for example, bolts 374. The housing 304 can be disposed such that a column 308 can extend through an opening in the side of the CPM and at least partially into the vacuum chamber 302. The column 308 can comprise a substantially rigid body portion 310 and a tip portion 312 including a movable holder 314 configured to hold the workpiece W. The positioning system 300 can be configured to adjust the position of a workpiece W using one or more drive units, as described in more detail below.

In the illustrated embodiment, the body portion 310 has a cylindrical shape and the tip portion 312 has a truncated conical shape, at least in part. However, in other embodiments the body and the tip portion can have any of various shapes. For example, the body and/or the tip portion can have a square, rectangular, triangular, etc. shape in cross-section. In some embodiments, the body can further comprise a truss-like construction such that the body has a high mechanical resonance frequency. A high mechanical resonance frequency can prevent or mitigate vibrations of the workpiece, allowing for improved high resolution imaging of the workpiece.

The positioning system 300 can be configured to move a workpiece W disposed in the holder 314 in 5 directions of motion associated with 5 degrees of freedom (e.g., translations along the X-, Y-, Z-axes and rotations $\alpha$ and $\beta$ about the X-axis and the Y-axis, respectively). In some instances, translational motion can include coupled rotational motion. For example, translation along the Y-axis can be coupled with a small of $\gamma$-tilt, and translation along the Z-axis can be coupled with a small degree of $\beta$-tilt. In some instances, the small degree of tilt can be mitigated and/or compensated for by an opposing movement. For example, in a particular embodiment, inadvertent or undesired $\beta$-tilt movement during translation along the Z-axis can be compensated by generating an opposing $\beta$-tilt using drive unit 320d. With reference to coordinate system 328, the X-, Y-, and Z-axes are mutually orthogonal to one another; $\alpha$-tilt is rotation around the X-axis; $\beta$-tilt is rotation around the Y-axis; and $\gamma$-tilt is rotation about the Z-axis.

The positioning system 300 can comprise one or more carriage elements coupled to one or more drive units. In the illustrated embodiment, the positioning system comprises a first carriage 316, also referred to as the sample carriage, and a second carriage 318, also referred to as the $\alpha$-tilt carriage. In some embodiments, the first carriage 316 can include a platform 315 (see FIG. 3B), such as a Stewart platform, comprising, for example, three strut members 371 disposed in a triangular shape, and three additional strut members 322 extending axially along the length of the second carriage. A "platform" as used herein means a configuration of struts or other support members configured to permit motion with respect to one or more degrees of freedom. The three strut members 371 are coupled to the first carriage 316 and have a fixed length and can, in combination with the strut members 322 be configured to allow 3-directional movement of the workpiece W. The platform 315 can be positioned in the Z-Y plane (also referred to as the O-plane for ease of reference) and can be coupled to the first carriage 316 and the second carriage 318, as described in more detail below.

In the illustrated embodiment, the first carriage 316 can comprise a specimen carriage 375 (see FIG. 4) on which the workpiece W is mounted. The specimen carriage 375 can be coupled to the holder 314 via a rotational sliding bearing (not shown). The bearing allows workpiece W to be positioned about the Y-axis (e.g., $\beta$-tilt). This allows the first carriage to undergo a $7^{th}$ independent positional adjustment that provides an additional adjustment mechanism for $\beta$-tilt.

Referring now to FIG. 3B, the platform 315 can comprise one or more elastic strut members 371. In the illustrated embodiment, the platform 315 comprises three elastic strut members 371a, 371b, 371c. The elastic strut members 371 can be substantially rigid along a first axis (e.g., along the length of the strut) and can be substantially flexible along one or more axes transverse to the first axis. The elastic strut members 371 can couple the first carriage 316 and the second carriage 318 to one another. In some particular embodiments, the elastic strut members 371 can comprise a stainless spring-steel elastic section. In some particular embodiments, the end portions 369, 373 of the elastic strut members can be thinner than a central portion 365, for example, the end portions 369, 373 can have a diameter or thickness of approximately 0.25 mm and the central portion can have a thickness of approximately 1 mm. The end portions 369, 373 can have a length that is approximately $1/16^{th}$ of the full length of the strut member 371. For example, the elastic strut members can have a length of approximately 22 mm and the end portions 369, 373 can have a length of between approximately 3 and 3.5 mm. In some particular embodiments, the column 308 can have a diameter of approximately 38 mm.

As shown in FIG. 3C, the first carriage 316 and second carriage 318 can be separated from one another via a helical or spiral cut 367. In the illustrated embodiment, the first and second carriages 316, 318 were formed as a single piece and cut apart into separate pieces via the spiral cut 367. In other embodiments, the first and second carriages 316, 318 can be formed as separate pieces and disposed adjacent one another such that the spiral cut 367 is defined between them. The spiral cut 367 can be configured such that the first end portion 369 of each elastic member 371 can couple the first carriage 316 and the second end portion 373 of each elastic member can couple the second carriage 318, as shown in FIG. 3B. Due to the shape of the cut 367, the elastic strut members 371 can be positioned within the same plane (e.g., the O-plane) while coupling both the first carriage 316 and the second carriage 318. The elastic members 371 can be coupled to the first and/or second carriages via welding, brazing, or other means.

The coupling of the elastic members 371a, 371b, and 371c fixes the first carriage 316 relative to the second carriage 318 in three directions (e.g., three degrees of freedom). The elastic members 371a, 371b, 371c can have a fixed length and can be configured to allow movement of the first carriage 316 in the X-direction, and $\beta$- and $\gamma$-tilt about the Y- and Z-axes, respectively.

Referring to FIG. 3A, the first carriage 316 can be coupled to four drive units 320 (e.g., drive units 320a, 320b, 320c, and 320d) (see e.g., FIG. 4) which are movable along the X-axis relative to one or more members 321, which are stationary relative to the second carriage 318 (referred to hereinafter as "stationary members" 321). The second carriage 318 can be coupled to one drive unit 324, as described in more detail below.

In the illustrated embodiment, all four drive units 320 are movable relative to the same stationary member 321. However, in other embodiments, each drive unit 320 can have a respective stationary member 321. In still other embodiments, drive units 320d and 320c can be movable relative to the same stationary member and drive units 320a and 320b can be movable relative to respective stationary members.

The second carriage 318 can be disposed on an external surface 306 of the vacuum chamber 302 and can house one or more of the drive units. For example, in the illustrated embodiment, the second carriage 318 houses drive units 320a-320d. An O-ring 372 can be disposed between the housing 304 and the external surface 306 of the CPM. The O-ring 372 can be configured to separate the vacuum within the vacuum chamber 302 from the ambient atmospheric pressure.

In the illustrated embodiment of FIG. 3A the vacuum seal 372 creates vacuum around the whole positioning system 300, so all components like α-tilt bearing 326, encoders, piezo motors and all cabling are inside the vacuum. These components may pose a risk to contaminate the vacuum and therefore in some embodiments it is preferable to dispose these components outside the vacuum chamber. In an alternative embodiment, the vacuum sealing is made in such a way that selected components (e.g., the α-tilt bearing 326, encoders, piezo motors, and cables) can remain in the ambient air. In such an embodiment, the static vacuum seal 372 can be removed from FIG. 3A, the housing 306 can be provided with a projection that extends towards the vacuum chamber 302 and that surrounds the column 308. This projection can be provided with a ring-shaped groove that faces the cylindrical outer jacket of the column 308. In said groove an O-ring can be disposed that creates a vacuum seal between the vacuum chamber 302 and the ambient atmospheric pressure. This vacuum seal can be a dynamic vacuum seal that allows for the required α-tilt rotation in the bearing 326. Inside the column 308, a vacuum wall can be disposed with holes through which the strut members 322 can extend. Around these strut members 322, axially compliant bellows with a diameter as small as possible, which may be made from steel, can be provided to complete the vacuum seal.

The second carriage 318 can be coupled to one or more bearings 326 which allow the second carriage to tilt or rotate relative to the housing 304 when actuated by drive unit 324. For example, in some embodiments, the second carriage 318 can tilt or rotate exclusively about the X-axis (e.g., α-tilt) relative to the housing 304.

In some embodiments, one or more of the drive units can be piezo drive units (such as drive units 202 and 204 described above), and/or cylindrical drive units with a piezo motor (e.g., a cylindrical ceramic drive rail). For example, in the illustrated embodiment, drive units 320a-320d are piezo drive units, and drive unit 324 is a cylindrical drive unit with a piezo motor. The cylindrical drive unit with a piezo motor can, for example, drive the second carriage 318 tangentially against a cylindrical ceramic drive rail. The piezo drive units 320a-320d can be "walking" or stepping piezo drive units, such as such as Heinmade Piezo Stepper (HMPS) actuators available from Heinmade BV. The piezo drive units can comprise first and second sets of actuators, each comprising clamp and/or shear elements. The sets of actuators can be configured to be actuated in an alternating motion such that when the first set of actuators engages with and exerts force on the stationary member 321, the second set of elements disengages or releases the stationary element and vice versa. In some embodiments, as shown, the piezo components of the drive unit 320 can be located on the stationary member 321, such that movement of the piezo components moves the drive units (e.g., in an axial or rotational direction). This allows the piezo components to "walk" along (e.g., move relative to) the drive unit 320 in order to move the drive unit 320. In other embodiments, the piezo components can be located on the drive unit 320. Additional details of the piezo drive units can be found in the application entitled "Systems and Methods of Clamp Compensation," filed herewith, and also referred to by attorney reference number 9748-102339-01, and in the application entitled "Systems and Methods of Hysteresis Compensation," filed herewith, and also referred to by attorney reference number 9748-102338-01.

One or more loading units 376 can be configured to bias one or more of the drive units 320a-320d against the one or more stationary members 321. The illustrated embodiment depicts one loading unit 376 disposed above the drive units 320a-320d, however, in other embodiments, an additional loading unit 376 can be disposed below the drive units 320a-320d. Loading unit 376 can comprise a biasing member 378 (e.g., a spring) and one or more rollers 380. The loading unit 376 can maintain a biasing force against the one or more drive units such that the drive units remain in contact with the piezo components during movement.

In some embodiments, an additional loading unit 325, such as a preload spring, can extend between drive unit 324 and second carriage 318 such that force exerted by drive unit 324 is applied to second carriage 318.

The drive units 320 can be coupled to the first carriage 316 via a plurality of strut members 322 (e.g., strut members 322a, 322b, 322c, 322d). Movement of the drive units 320 relative to the stationary member 321 causes corresponding movement of the strut members 322. In other embodiments, the strut members 322 can be coupled to mover elements and the drive units 320 can remain stationary. In such embodiments, the actuation of the drive units 320 can cause movement of the mover elements and therefore movement of the strut members. The distal end portion of strut 322d (that is, the end portion extending into the vacuum chamber 302) can be coupled to a rotational sliding bearing and/or axel coupled to the first carriage 316. The bearing is configured to allow the first carriage 316 to rotate around the Y-axis (e.g., β-tilt).

Drive units 320a, 320b, and 320d (see FIG. 4) can be positioned such that they actuate along the X-axis in a common plane (e.g., an X-Y plane as shown by coordinate system 328), and drive unit 320c can be positioned to actuate along an axis parallel to (e.g., not co-planar with) the common plane. In other words, drive unit 320c and strut 322c can be below drive units 320a, 320b, and 320d and struts 322a, 322b, and 322d in the orientation shown in FIG. 3. This configuration allows all drive units to be positioned at or below the plane in which the workpiece W is disposed, which can help mitigate vibrations that could affect the workpiece.

In other embodiments, the drive units 320 and struts 322 can be positioned in a variety of locations in the Y-Z plane. For example, in some particular embodiments, the drive units are positioned such that each drive unit is 90 degrees from each adjacent drive unit about an internal circumference of the column 308. In still other embodiments, the drive units 320 and struts 322 can be positioned such that they are not parallel with the X-axis. For example, the drive units 320 and struts 322 can be positioned at an angle relative to the body portion 310 of the column 308.

The drive units 320a-320d can be configured to move relative to a rear wall 330 of the housing 304 such that the strut members 322*a*-322*d* move along their axes toward and away from the rear wall 330. Drive units 320*a*-320*d* (see FIG. 4) (along with struts 322*a*-322*d*) can be configured such that movement of the drive units 320*a*-322*d* causes the first carriage 316 and therefore the holder 314 (including specimen carriage 375 and workpiece W) to move along the X-, Y-, and Z-axes, as well as rotate about the Y-axis (β-tilt). For example, movement of all four drive units 320*a*-320*d* can move the first carriage backwards and/or forwards along the X-axis. Movement of either 320*a* or 320*b* while keeping 320*c* and 320*d* stationary can result in movement of the first carriage 316 along the Y-axis, or along both the X- and Y-axes.

Drive unit 320*c* can be configured such that movement of the drive unit 320*c* toward or away from the rear wall 330 of the housing 304 causes the first carriage to move along the Z-axis, combined with a small rotation about the Y-axis (e.g., β-tilt), which can be prevented or mitigated by movement of drive unit 320*b*. Drive unit 320*d* can be configured such that movement of the drive unit 320*d* (along with strut 322*d*) toward or away from the rear wall 330 of the housing 304 causes the workpiece W held by the first carriage 316 to rotate about the Y-axis (β-rotation).

Drive unit 324 can be coupled to the second carriage 318 and can be configured such that movement of drive unit 324 causes the second carriage 318 (and therefore drive units 320*a*-320*d*) to rotate about the X-axis (α-rotation), as shown by coordinate system 328.

By actuating the drive units 320*a*-320*d* and 324 separately or in any combination, the positioning system 300 can move the workpiece W with five degrees of freedom (X, Y, Z, α, and β). That is, the positioning system 300 can be configured to position the workpiece along at least three linear axes (e.g., the X-, Y-, and Z-axes, as shown with respect to coordinate system 328) and around at least two rotational axes (e.g., rotation about the X-axis (α-tilt), and about the Y-axis (β-tilt)). Accordingly, positioning system 300 can position the workpiece W at a selected location relative to, for example, a transmission electron microscope (TEM).

Each drive unit 32*a-d* can comprise a respective position encoder 333. Each position encoder 333 can be similar to encoder 248 described above and can comprise a respective encoder scale. In other embodiments, in lieu of or in addition to the encoder scale, each drive unit can comprise a mirror plane on an end portion thereof. The encoder scales and/or mirror planes can be mounted on, for example, the strut members 322 and/or the drive units 320. The position encoders can determine the position of each strut member (322*a*-322*d*) and/or drive unit (320*a*-320*d*), respectively, based on the encoder scales. The encoder scales can be coupled to or formed integrally with the strut members 322*a*-322*d* and/or drive units 320*a*-320*d*. The positioning system 300 can further comprise an additional position encoder 335 including laser fiber 337. Position encoder 335 can be configured to determine the amount of rotation about the X-axis (e.g., the amount of α-tilt).

The position encoders 333, 335 can be, for example, optical encoders, laser fiber displacement encoders (e.g., Fiber Bragg grating sensors), and/or a laser fiber velocity encoder (e.g., a vibrometer). In some embodiments, the position encoders can be positioned such that a suitable optical gap is formed between a respective position encoder and position encoder scale and/or mirror plane.

Each drive unit 320*a*-320*d* and 324 can be coupled to one or more wires or cables 332 configured to supply power to the drive unit. The cables 332 and/or optical fibers (e.g., the optical fibers that serve as part of the position encoders) can be disposed within the housing 304 and can exit the housing 304 through a vacuum seal 334. The seal can comprise, for example, one or more multi-pin connectors and fiber throughputs. This configuration can help prevent the introduction of air into the vacuum chamber 302. The housing 304 can additionally comprise a central chamber 338 in which the cables 332 can be disposed. The chamber 338 can be sized to allow deflection and movement of the cables 322 when the drive units 320 are actuated. In some particular embodiments, the stroke of drive units 320*a*-320*d* can be about +/−2 mm, and the stroke of drive unit 324 (α-tilt) can be about +/−60°.

Upon completion of imaging and/or processing, the workpiece W can be replaced with a new workpiece. In some embodiments, the workpiece can be replaced by inserting a new workpiece into the holder 314 while the positioning system remains in place. In such embodiments, the old workpiece W can be removed through a load lock coupled to the vacuum chamber and the new workpiece W' can be inserted through the load lock. In other embodiments, the entire positioning system 300 can be dismounted from the vacuum chamber 302.

Example 4

Figure 5:
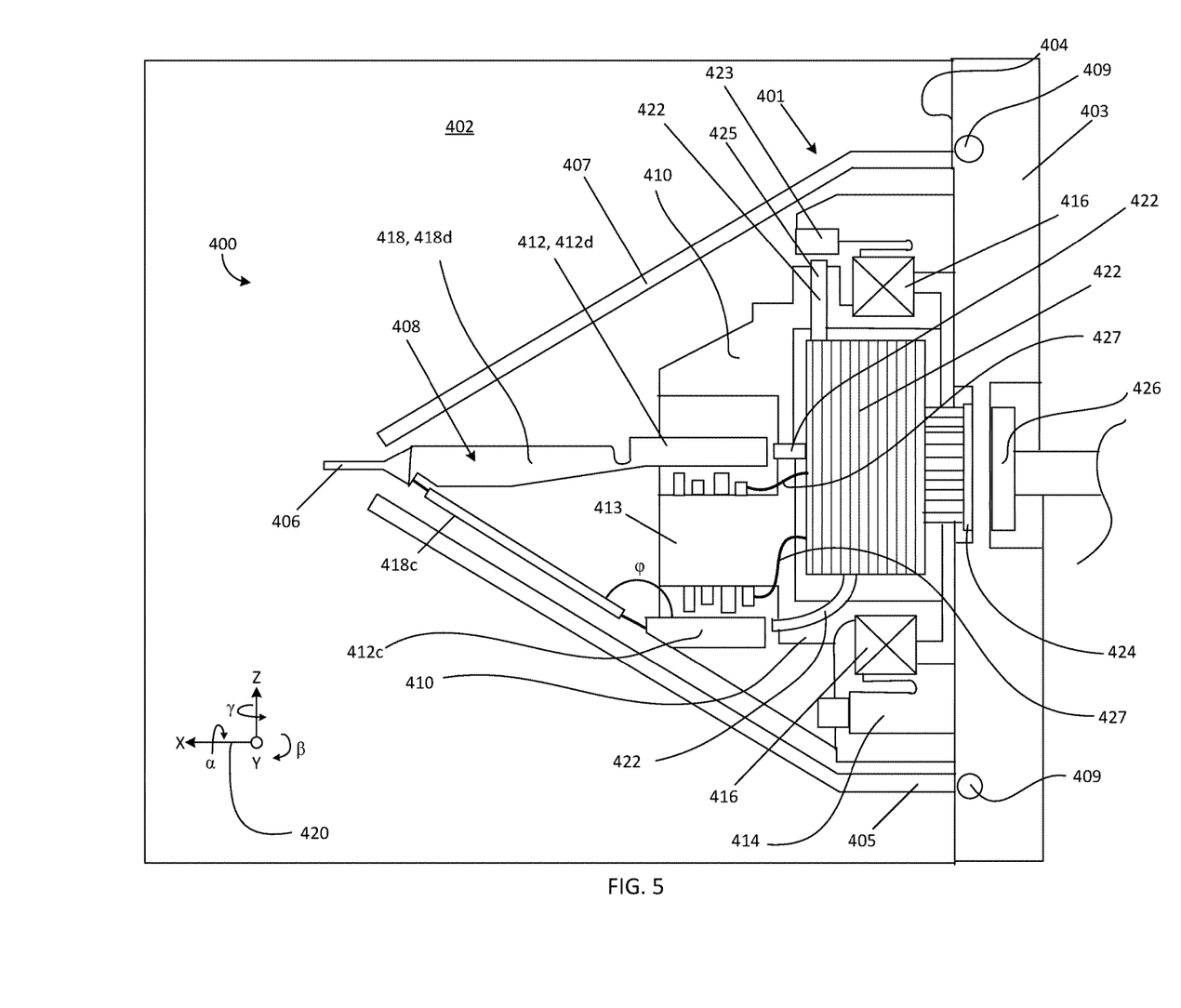
FIG. 5 illustrates a schematic cross-sectional side view of another representative embodiment of a positioning system mounted to the side of an electron microscope system.
Figures 6, 7:
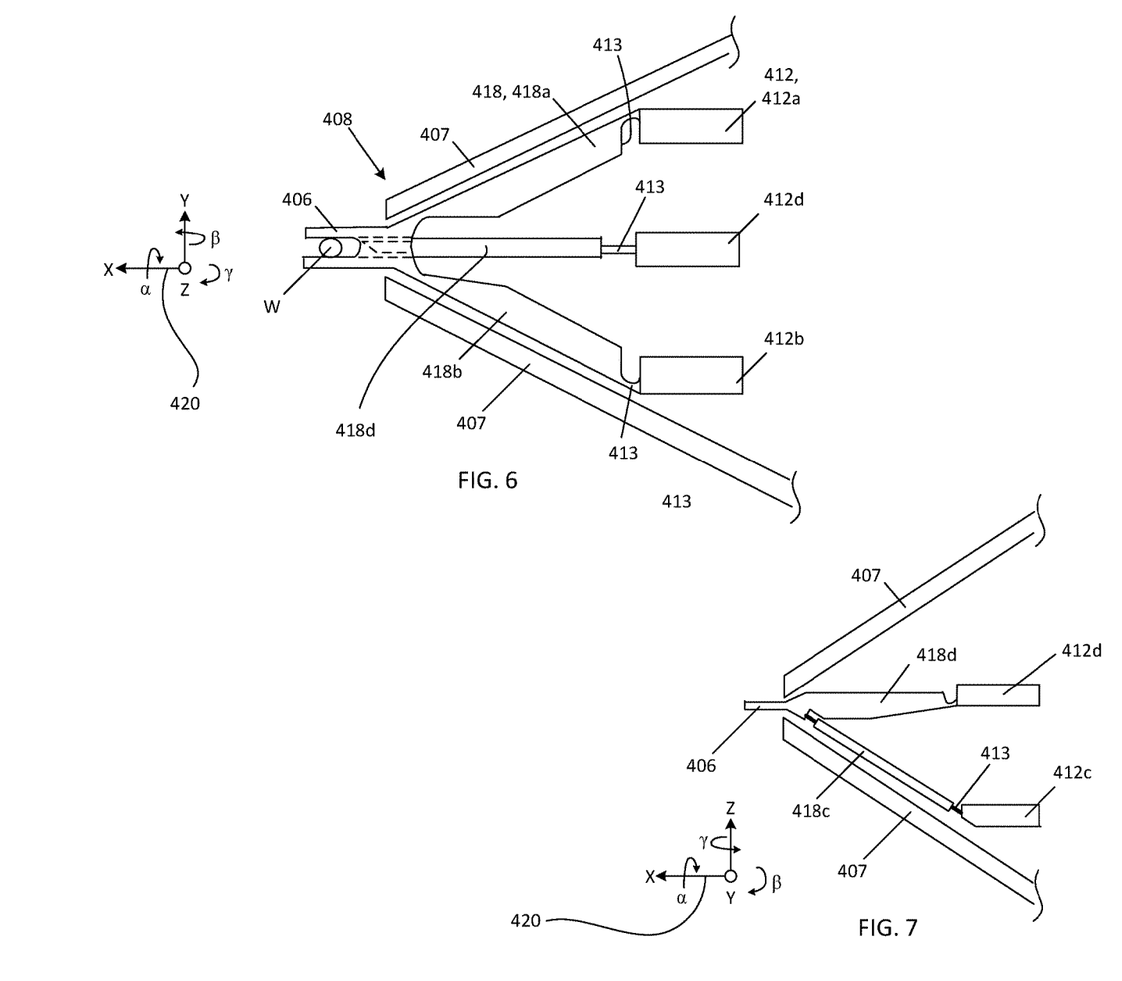
FIG. 6 illustrates a top-down view of a portion of the positioning system of FIG. 5.
FIG. 7 illustrates a cross-sectional side view of a portion of the positioning system of FIG. 5.

FIGS. 5-7 illustrate another exemplary embodiment of a positioning system 400. Positioning system 400 is similar to positioning system 300, described above, except that positioning system 400 does not include a body portion 310 and positioning system 400 is configured such that the entire positioning system (including the drive units) can be disposed within the vacuum chamber 402 of the CPM. Accordingly, positioning system 400 can be much smaller than positioning system 300.

The smaller size of the positioning system 400, and the smaller length of selected components (such as the elastic members 418) can prevent or mitigate vibrations of the workpiece, allowing for improved high resolution imaging of the workpiece.

Referring to FIG. 5, positioning system 400 can include a housing 401 and can be mounted on an internal surface 404 of the CPM (e.g., an internal surface of the vacuum chamber 402). In some embodiments, such as the illustrated embodiment, the housing 401 can comprise a cylindrical portion 405 and a conical portion 407. In other embodiments, the housing 401 can have any of various shapes. The housing 401 can be mounted to the vacuum chamber using one or more O-rings 409. The positioning system 400 can comprise a holder 406 configured to hold a workpiece W (see FIG. 6). The positioning system 400 can be configured to adjust the position of the workpiece W using one or more drive units, as described in more detail below.

The positioning system 400 can be configured to move a workpiece W disposed in the holder 406 in 5 directions (e.g., translations along the X-, Y-, Z-axes and rotations α and β about the X-axis and the Y-axis, respectively). With reference to coordinate system 420, the X-, Y-, and Z-axes are mutually orthogonal to one another; α-tilt is rotation around the X-axis; and β-tilt is rotation around the Y-axis.

The positioning system 400 can comprise one or more carriage elements coupled to one or more drive units. In the illustrated embodiment, the positioning system comprises a first carriage 408, and a second carriage 410 (also referred to as the α-carriage). The first carriage 408 can be coupled to four drive units 412 (e.g., drive units 412*a*, 412*b*, 412*c*, and 412*d*) (see e.g., FIG. 6). The second carriage 410 can be coupled to one or more drive units 414 (e.g., one in the illustrated example), as described in more detail below.

The four drive units 412 can be movable relative to one or more members 413, stationary with respect to second carriage 410 (referred to hereinafter as "stationary members" 413). In the illustrated embodiment, all four drive units 412 are movable relative to the same member 413. However, in other embodiments, each drive unit 412 can have a respective stationary member 413. In still other embodiments, drive units 412c and 412d can both be movable relative to the same stationary member 413 and drive units 412a and 412b can be movable relative to respective stationary members.

The second carriage 410 can house the drive units 412a-412d. The second carriage 410 can be coupled to one or more bearings 416 which allow the second carriage to tilt or rotate relative to the inner surface 404 of the sidewall 403 of vacuum chamber 402, thus rotating drive units 412a-412d and the first carriage 408.

In some embodiments, one or more of the drive units can be piezo drive units, and/or cylindrical drive units with a piezo motor. For example, in the illustrated embodiment, drive units 412a-412d are piezo drive units with the piezo components located on the stationary member 413, and drive unit 414 is a cylindrical drive unit with a piezo motor. The piezo drive units and cylindrical drive units can be similar to drive units 320, 324 described previously. In some embodiments, as shown, the piezo components of the drive unit 412 can be located on the stationary member 413, such that movement of the piezo components moves the drive units (e.g., in an axial or rotational direction). In other embodiments, the piezo components can be located on the drive unit 412.

In some embodiments, one or more loading units (not shown) can be configured to bias one or more of the drive units 412a-412d, 414 against the one or more stationary members. The loading units can be similar to loading units 376 and 325 described above and can comprise a biasing member (e.g., a spring) and/or one or more rollers. The loading unit(s) can maintain a biasing force against the one or more drive units such that the drive units remain in contact with the piezo components during movement.

The first carriage 408 can comprise one or more elastic members 418. Drive units 412 can be coupled to the elastic members 418 such that movement of the drive units 412 results in movement of the carriage 408 and therefore of the workpiece W. The elastic members 418 can comprise portions having a thinner thickness or diameter. For example, the thinner portions can be formed by drilling or by wire electrical discharge machining (wire-EDM). The thinner portions (such as portions 413 shown in FIGS. 6-7) can be configured as hinges. In the illustrated embodiment, the first carriage 408 comprises four elastic members, 418a-418d, each coupled to one of the drive units 412a-412d, respectively. In some embodiments, the elastic members can comprise stainless spring-steel. In some particular embodiments, the elastic members can have portions which are thinner or thicker than the adjacent portions of the elastic member.

Drive units 412a, 412b, 412d (see FIG. 6) can be positioned such that they actuate along axes in a common plane (e.g., an X-Y plane as shown by coordinate system 420), and drive unit 412c can be positioned to actuate along an axis parallel to (e.g., not co-planar with) the common plane. In other words, drive unit 412c can be below drive units 412a, 412b, and 412d in the orientation shown in FIG. 5. This configuration allows all drive units to be positioned at or below the plane in which the workpiece W is disposed, which can help mitigate vibrations that could affect the workpiece. As shown in FIG. 5, elastic member 418c can be coupled to drive unit 412c at an angle $\phi$ such that the elastic member 418d extends upwards toward and is coupled to the first carriage 408. Varying the angle $\phi$ can vary the amount of movement required by drive unit 412d to move the workpiece a selected amount.

In other embodiments, the drive units 412 and struts 418 can be positioned in a variety of locations in the Y-Z plane. For example, in some particular embodiments, the drive units are positioned such that each drive unit is 90 degrees from each adjacent drive unit about an internal circumference of the conical portion 407. In still other embodiments, the drive units 320 and struts 322 can be positioned such that they are not parallel with the X-axis. For example, the drive units 320 and struts 322 can be positioned at an angle relative to the body portion 310 of the column 308.

Referring now to FIG. 6, each elastic member can comprise one or more joints 413. In the illustrated embodiments, the joints 413 are cutouts in the end portions of the elastic members 418 configured to allow the elastic members 418 to be coupled to the drive units 412 at an off-center location (e.g., offset from a central longitudinal axis of the drive unit). In such a configuration, movement of a drive unit along an axis, for example, the X-axis, can cause movement of an elastic member along, for example, the X- and Y-axes. In the illustrated embodiment, the joints are positioned directly adjacent the drive units, however, in other embodiments, the joints can be positioned in any of various locations along the elastic member (see, e.g., FIG. 8).

In other embodiments, the drive units 412 can be positioned in other locations. For example, in some particular embodiments, the drive units are positioned such that each drive unit is 90 degrees from each adjacent drive unit. For example, the drive units can be positioned positioned around an internal circumference of the positioning system, when the positioning system comprises a conical or cylindrical housing.

The drive units 412a-412d can be configured to move relative to the inner wall 404 of the vacuum chamber 402 such that the elastic members 41a-418d move along their axes toward and away from the inner wall 404. Drive units 412a-412d (see FIG. 6) (along with elastic members 418a-418d) can be configured such that movement of the drive units 412 causes the first carriage 408 and therefore holder 406 (including workpiece W) to move along the X-, Y-, and Z-axes, as well as rotate about the Y-axis ($\beta$-tilt). For example, movement of all four drive units 412a-412d can move first carriage 408 forwards and/or backwards along the X-axis. Movement of either 412a or 412b while keeping 412c and 412d stationary can result in movement of the first carriage 408 along the Y-axis, or along both the X- and Y-axes.

Drive unit 412d can be configured such can be configured such that movement of the drive unit 412d toward or away from the internal surface 404 of the CPM causes the first carriage 408 to move along the Z-axis. Drive unit 412c can be configured such that movement of the drive unit 412c toward or away from the inner wall 404 of the vacuum chamber 402 causes the first carriage to rotate about the Y-axis ($\beta$-rotation). The end portion of the elastic member 418d can be coupled to a sliding bearing and/or an axel in order to create the $\beta$-rotation.

Drive unit 414 can be coupled to the second carriage 410 and can be configured such that movement of drive unit 414 causes the second carriage 410 (and therefore drive units 412a-412d and first carriage 408) to rotate about the X-axis (α-rotation) (see e.g., coordinate system 420 in FIG. 5).

By actuating the drive units 412a-412d and 414 separately or in any combination, the positioning system 400 can move the workpiece W with five degrees of freedom (X, Y, Z, α, and β). That is, the positioning system 400 can be configured to position the workpiece along at least three linear axes (e.g., translation along the X-, Y-, and Z-axes, as shown with respect to coordinate system 420) and around at least two rotational axes (e.g., rotation about the X-axis (α-tilt), and about the Y-axis (β-tilt)). Accordingly, positioning system 400 can position the workpiece W at a desired location relative to, for example, a transmission electron microscope (TEM).

Each drive unit 412, 414 can comprise a respective position encoder 422. Each position encoder 422 can be similar to encoder 248 described above and can comprise a respective encoder scale. The encoder scales can be mounted on, for example, the stationary member 413 and/or drive units 412, 414. The position encoders can be, for example, optical encoders and/or laser fiber displacement encoders. The position encoders can determine the position of each drive unit 412 and/or elastic member 418 respectively, based on the encoder scales. The encoder scales can be coupled to or formed integrally with the stationary member(s) 413 and/or with the drive units 412, 414. The positioning system 400 can further comprise one or more additional position encoders 423 including laser fiber 425. Position encoder 423 can be configured to determine the amount of rotation of the second carriage 410 about the X-axis (e.g., the amount of α-tilt).

As described above with respect to positioning system 300, the position encoders 422, 423 can be, for example, optical encoders, laser fiber displacement encoders (e.g., Fiber Bragg grating sensors), and/or a laser fiber velocity encoder (e.g., a vibrometer). In some embodiments, the position encoders can be positioned such that a suitable optical gap is formed between a respective position encoder and position encoder scale and/or mirror plane.

Each drive unit 412a-412d, 414 can be coupled to one or more wires or cables 427 configured to supply power to the drive unit. The cables and/or optical fibers (e.g., the fibers used in the position encoders 422, 423) can exit the vacuum chamber through a vacuum seal comprising, for example, first and second multi-pin connectors 424, 426. The cables 427 and/or fibers can be disposed within the second carriage 410 and can be coupled to the first multi-pin connector 424. The first multi-pin connector 424 can extend through the sidewall 403 and couple a second multi-pin connector 426, which can be coupled to a power supply (not shown). This configuration can help prevent the introduction of air into the vacuum chamber 402.

Upon completion of imaging and/or processing, the workpiece W can be replaced with a new workpiece. In some embodiments, the workpiece can be replaced using a loadlock on the vacuum chamber to remove the workpiece W and insert a new workpiece W' into the holder 406. In other embodiments, the entire positioning system 400 can be dismounted from the vacuum chamber 402 to replace the workpiece.

Example 5

Figure 8:
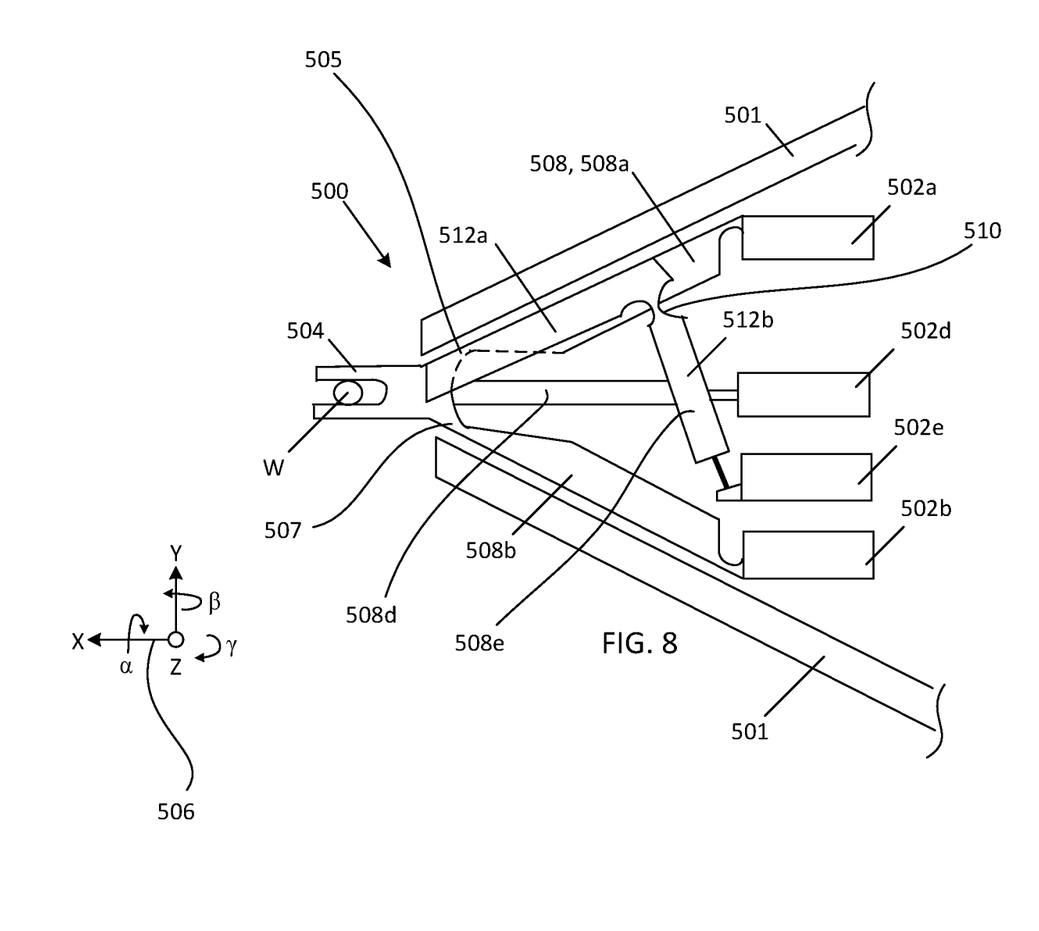
FIG. 8 illustrates a representative embodiment of a first carriage for use with a positioning system.

FIG. 8 illustrates an exemplary embodiment of a first carriage 500 and associated drive units 502 for a positioning system, such as positioning systems 300 and 400 described above. First carriage 500 comprises a holder 504 configured to hold a workpiece W. First carriage 500 can be housed in a housing 501, similar to conical housing 407 described above. In some embodiments, such as the illustrated embodiment, the housing 501 can comprise a conical or partially conical shape. In other embodiments, the housing 501 can have any of various shapes.

The first carriage 500 can be configured to be movable such that the workpiece W can move in 6 directions (e.g., translation along the X-, Y-, Z-axes as shown by coordinate system 506, and rotation about the X-, Y-, and Z-axes, which can be referred to as β-, α-, and γ-rotation, respectively).

As shown, first carriage 500 can be coupled to five drive units 502a-502e. Drive units 502a-502d can be positioned as described previously with respect to the drive units 412a-412d of positioning system 400 and can be coupled to the first carriage 500 via elastic members 508a-508d similar to elastic members 418a-418d of positioning system 400. Drive unit 502c and elastic member 508c are below (e.g., extending into the plane of the page along the Z-axis) drive unit 502d and elastic member 508d in the configuration shown in FIG. 8. First carriage 500 can further comprise an additional drive unit 502e, which can be coupled to the first carriage 500 via elastic member 508e.

Additional drive element 502e and elastic member 508e can be configured to rotate the holder 504 (and therefore workpiece W) about the Z-axis (e.g., γ-tilt). Elastic member 508e can have a substantially L-shaped configuration comprising a joint 510. Due to the shape of the elastic member 508e, longitudinal movement (e.g., movement along the X-axis) of the drive unit 502e causes γ-tilt of the holder 504 (and workpiece W) by way of elastic hinges 505 and 507. In some instances, the γ-tilt can be coupled with a small amount of translation along the Y-axis, which can be compensated for using other members 508a-d. In the illustrated embodiment, the joint 510 is disposed substantially in the center of the elastic member 508 to define two similarly-sized portions 512a and 512b of the elastic member 508e. However, in other embodiments, the joint 510 can be positioned nearer or further to the drive unit 502e, which can be used to vary the amount of movement required to move the workpiece W.

In some embodiments, the first portion 512a can be coupled to a ball joint (not shown) configured to allow drive unit 508e to provide γ-tilt about the Z-axis. In some particular embodiments, the ball joint can have a radius of 30 mm.

In the illustrated embodiment, the first portion 512a of elastic member 508e is positioned above elastic member 508a. However, in other embodiments, the first portion 512a may be positioned below the elastic member 508a. In still other embodiments, the first portion 512a may be positioned above or below elastic member 502b.

General Considerations

For purposes of this description, certain aspects, advantages, and novel features of the embodiments of this disclosure are described herein. The disclosed methods, apparatus, and systems should not be construed as being limiting in any way. Instead, the present disclosure is directed toward all novel and nonobvious features and aspects of the various disclosed embodiments, alone and in various combinations and sub-combinations with one another. The methods, apparatus, and systems are not limited to any specific aspect or feature or combination thereof, nor do the disclosed embodiments require that any one or more specific advantages be present, or problems be solved.

Although the operations of some of the disclosed embodiments are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods. Additionally, the description sometimes uses terms like "provide" or "achieve" to describe the disclosed methods. These terms are high-level abstractions of the actual operations that are performed. The actual operations that correspond to these terms may vary depending on the particular implementation and are readily discernible by one of ordinary skill in the art.

All features described herein are independent of one another and, except where structurally impossible, can be used in combination with any other feature described herein.

As used in this application and in the claims, the singular forms "a," "an," and "the" include the plural forms unless the context clearly dictates otherwise. Additionally, the term "includes" means "comprises." Further, the terms "coupled" and "associated" generally mean electrically, electromagnetically, and/or physically (e.g., mechanically or chemically) coupled or linked and does not exclude the presence of intermediate elements between the coupled or associated items absent specific contrary language.

In the following description, certain terms may be used such as "up," "down," "upper," "lower," "horizontal," "vertical," "left," "right," and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object.

Unless otherwise indicated, all numbers expressing material quantities, angles, pressures, molecular weights, percentages, temperatures, times, and so forth, as used in the specification or claims are to be understood as being modified by the term "about." Accordingly, unless otherwise indicated, implicitly or explicitly, the numerical parameters set forth are approximations that can depend on the desired properties sought and/or limits of detection under test conditions/methods familiar to those of ordinary skill in the art. When directly and explicitly distinguishing embodiments from discussed prior art, the embodiment numbers are not approximates unless the word "about" is recited. Furthermore, not all alternatives recited herein are equivalents.

In view of the many possible embodiments to which the principles of the disclosure may be applied, it should be recognized that the illustrated embodiments are only preferred examples and should not be taken as limiting the scope of the disclosure. Rather, the scope of the disclosure is at least as broad as the following claims. We therefore claim all that comes within the scope and spirit of these claims.

I claim:

1. A positioning system, comprising:
a first carriage comprising a holder for holding a workpiece, the first carriage being coupled to a plurality of first drive units configured to translate the first carriage and the workpiece along mutually orthogonal first, second, and third axes, and rotate the first carriage and the workpiece around the second axis, the first carriage coupled to the plurality of first drive units by an associated plurality of strut members;
a second carriage coupled to the first carriage and housing the plurality of first drive units within an interior space of the second carriage, the second carriage being coupled to one or more rotational drive units configured to rotate the second carriage, the first carriage, the plurality of first drive units, and the workpiece around the first axis; and
wherein the plurality of strut members is arranged internally to the second carriage.

2. The positioning system of claim 1, further comprising a column extending from the second carriage and having a body portion and a tip portion, wherein the first carriage is disposed adjacent the tip portion and the strut members extend through the body portion.

3. The positioning system of claim 1, wherein the plurality of strut members is a first set of strut members, and
wherein the first carriage is coupled to the second carriage via a second set of strut members comprising a plurality of elastic strut members.

4. The positioning system of claim 3, wherein the second set of strut members comprises first, second, and third elastic strut members each having a first end portion and a second end portion, and wherein the elastic strut members are disposed in a triangular shape such that the first end portion of each elastic strut member is coupled to the first carriage and the second end portion of each elastic strut member is coupled to the second carriage, and wherein the first, second, and third elastic strut members are disposed such that the first end portion of each respective elastic strut member is disposed adjacent the second end portion of an adjacent elastic strut member.

5. The positioning system of claim 1, wherein the plurality of first drive units comprises first, second, and third drive units configured to actuate along axes disposed within a common plane, and a fourth drive unit configured to actuate along an axis disposed in a plane parallel to the common plane.

6. The positioning system of claim 5, wherein the first and second drive units are configured to move the first carriage and the workpiece along the first and second axes, the third drive unit is configured to move the first carriage and the workpiece along the third axis, and the fourth drive unit is configured to rotate the first carriage and the workpiece around the second axis.

7. The positioning system of claim 5, wherein the first, second, third, and fourth drive units are coupled to the first carriage by first, second, third, and fourth elastic members, respectively.

8. The positioning system of claim 7, wherein the plurality of first drive units further comprise a fifth drive unit, the fifth drive unit configured to rotate the first carriage and the workpiece around the third axis.

9. The positioning system of claim 8, wherein the fifth drive unit is coupled to the first carriage by a fifth elastic member, and wherein the fifth elastic member comprises a first portion coupled to a second portion by a joint such that the fifth elastic member has an L-shape.

10. A charged particle beam system, comprising:
a vacuum chamber; and
a positioning system extending into the vacuum chamber and comprising:
a first carriage comprising a holder for holding a workpiece, the first carriage being coupled to a plurality of first drive units configured to translate the first carriage and the workpiece along first, second, and third axes, and rotate the first carriage and the workpiece around the second axis, the first carriage coupled to the plurality of first drive units by an associated plurality of strut members;

a second carriage coupled to the first carriage and housing the plurality of first drive units within an interior space of the second carriage, the second carriage being coupled to one or more rotational drive units configured to rotate the second carriage, the first carriage, the plurality of first drive units, and the workpiece around the first axis; and wherein the plurality of strut members is arranged internally to the second carriage.

11. The system of claim 10, wherein the positioning system is disposed within the vacuum chamber.

12. The system of claim 10, wherein the positioning system comprises a housing disposed on an outer surface of the vacuum chamber and a column extending into an interior of the vacuum chamber.

13. The system of claim 12, wherein the column comprises a body portion and a tip portion, and wherein the first carriage is disposed adjacent the tip portion.

14. The system of claim 10, the plurality of first drive units comprising first, second, and third drive units configured to actuate along axes disposed within a common plane, and a fourth drive unit configured to actuate along an axis disposed in a plane parallel to the common plane, wherein the first and third drive units are configured to move the workpiece along the first and second axes, the second drive unit is configured to move the workpiece along the third axis, and the fourth drive unit is configured to rotate the workpiece around the first axis.

15. A method, comprising:

actuating a plurality of first drive units coupled to a first carriage element holding a workpiece to position the first carriage element and the workpiece at a selected position along first, second, and third axes, and rotate the first carriage element and the workpiece to a selected position around the second axis, the first carriage element coupled to the plurality of first drive units by an associated plurality of strut members;

actuating one or more rotational drive units coupled to a second carriage element to rotate the second carriage element, the first carriage element, the plurality of first drive units housed within an interior space of the second carriage element, and the workpiece to a selected position around the first axis, the second carriage element being coupled to the first carriage element; and wherein the plurality of strut members is arranged internally to the second carriage.

16. The method of claim 15, wherein positioning the workpiece at a selected position comprises positioning the workpiece relative to a charged particle beam (CPB).

17. The method of claim 16, further comprising imaging the workpiece using the CPB.

18. The method of claim 15, further comprising actuating a first drive unit of the plurality of first drive units to position the first carriage element and the workpiece at a selected position around the third axis.

19. The positioning system of claim 1, wherein the plurality of struts comprises three struts disposed equidistantly around at least one axis of the second carriage.

20. The positioning system of claim 1, wherein the plurality of struts comprises first, second, and third struts, and wherein the first and second struts are positioned circumferentially around at least one axis of the second carriage such that they are radially opposite one another.

21. The positioning system of claim 20, wherein the third strut is positioned circumferentially about the at least one axis of the second carriage halfway between the first and second struts.

* * * * *